United States Patent
Kim

(10) Patent No.: US 10,707,828 B2
(45) Date of Patent: Jul. 7, 2020

(54) FILTER INCLUDING BULK ACOUSTIC WAVE RESONATOR

(71) Applicant: Samsung Electro-Mechanics Co., Ltd., Suwon-si (KR)

(72) Inventor: Chang Hyun Kim, Suwon-si (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 22 days.

(21) Appl. No.: 16/217,375

(22) Filed: Dec. 12, 2018

(65) Prior Publication Data

US 2019/0341903 A1 Nov. 7, 2019

(30) Foreign Application Priority Data

May 4, 2018 (KR) .................. 10-2018-0051962
Jul. 17, 2018 (KR) .................. 10-2018-0082714

(51) Int. Cl.
| H03H 9/02 | (2006.01) |
| H03H 9/60 | (2006.01) |
| H03H 9/00 | (2006.01) |
| H03H 9/205 | (2006.01) |
| H03H 9/17 | (2006.01) |

(Continued)

(52) U.S. Cl.
CPC ...... H03H 9/02086 (2013.01); H03H 9/0014 (2013.01); H03H 9/02157 (2013.01); H03H 9/171 (2013.01); H03H 9/205 (2013.01); H03H 9/582 (2013.01); H03H 9/605 (2013.01); *H03H 9/54* (2013.01)

(58) Field of Classification Search
CPC .... H03H 9/02157; H03H 9/171; H03H 9/205; H03H 9/0014; H03H 9/54; H03H 9/582; H03H 9/605; H03H 9/02086

USPC ................. 333/133, 186, 187, 188
See application file for complete search history.

(56) References Cited

U.S. PATENT DOCUMENTS

| 2008/0007369 A1 | 1/2008 | Barber et al. |
| 2008/0055021 A1 | 3/2008 | Ueda et al. |
| | (Continued) | |

FOREIGN PATENT DOCUMENTS

| JP | 2017-103654 A | 6/2017 |
| JP | 2017-220910 A | 12/2017 |
| | (Continued) | |

OTHER PUBLICATIONS

Korean Office Action dated Jun. 20, 2019 in corresponding Koren Patent Application No. 10-2018-0082714 (5 pages in English, 4 pages in Korean).

(Continued)

*Primary Examiner* — Robert J Pascal
*Assistant Examiner* — Jorge L Salazar, Jr.
(74) *Attorney, Agent, or Firm* — NSIP Law

(57) ABSTRACT

A filter includes series units and shunt units. Each series unit includes at least one bulk acoustic wave resonator. Each shunt unit includes at least one bulk acoustic wave resonator and is disposed between one of the series units and a ground. One of the series units or one of the shunt units includes a first bulk acoustic wave resonator, a second bulk acoustic wave resonator, and a third bulk acoustic wave resonator connected in series. The second bulk acoustic wave resonator has a polarity different from a polarity of the first bulk acoustic wave resonator and a polarity of the third bulk acoustic wave resonator.

19 Claims, 13 Drawing Sheets

(51) Int. Cl.
*H03H 9/58* (2006.01)
*H03H 9/54* (2006.01)

(56) References Cited

U.S. PATENT DOCUMENTS

| | | |
|---|---|---|
| 2008/0081398 A1 | 4/2008 | Lee et al. |
| 2013/0214878 A1* | 8/2013 | Gorisse ............. H03H 9/02086 333/187 |
| 2017/0163242 A1 | 6/2017 | Miyamoto et al. |
| 2017/0359050 A1 | 12/2017 | Irieda et al. |

FOREIGN PATENT DOCUMENTS

| | | |
|---|---|---|
| KR | 10-0890289 B1 | 3/2009 |
| KR | 10-2009-0039753 A | 4/2009 |
| KR | 10-1270461 B1 | 5/2013 |
| WO | WO 2008/008151 A2 | 1/2008 |

OTHER PUBLICATIONS

Japanese Office Action dated Nov. 26, 2019 in corresponding Japanese Patent Application No. 2018-241927 (6 pages in English, 3 pages in Japanese).

* cited by examiner

FILTER INCLUDING BULK ACOUSTIC WAVE RESONATOR

CROSS-REFERENCE TO RELATED APPLICATION

This application claims the benefit under 35 USC 119(a) to Korean Patent Application No. 10-2018-0051962 filed on May 4, 2018 and Korean Patent Application No. 10-2018-0082714 filed on Jul. 17, 2018 in the Korean Intellectual Property Office, the entire disclosures of which are incorporated herein by reference for all purposes.

BACKGROUND

1. Field

The following description relates to a bulk acoustic wave resonator and a filter including a bulk acoustic wave resonator.

2. Description of Background

With the recent rapid development of mobile communications devices, chemical devices, biotechnological devices, and the like, there is increasing demand for compact and lightweight filters, oscillators, resonant elements, acoustic resonant mass sensors, and the like, used in such devices.

A film bulk acoustic resonator (FBAR) is known as a means for implementing such compact and lightweight filters, oscillators, resonant elements, acoustic resonant mass sensors, and the like. Such an FBAR may be mass-produced at minimal cost and may be implemented in a subminiature size. In addition, such an FBAR may be implemented to have a high quality factor (Q) value and may be used in a frequency band of several gigahertz (GHz).

In general, an FBAR has a structure including a resonant portion implemented by sequentially laminating a first electrode, a piezoelectric layer, and a second electrode on a board. The operating principle of the FBAR is as follows. An electric field is induced in the piezoelectric layer by electrical energy applied to the first and second electrodes. The electric field may result in a piezoelectric phenomenon in the piezoelectric layer to allow the resonant portion to vibrate in a predetermined direction. As a result, a bulk acoustic wave may be generated in the same direction as the vibration direction of the resonant portion to cause resonance.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, a filter includes series units and shunt units. Each series unit includes at least one bulk acoustic wave resonator. Each shunt unit includes at least one bulk acoustic wave resonator and is disposed between one of the series units and a ground. One of the series units or one of the shunt units includes a first bulk acoustic wave resonator, a second bulk acoustic wave resonator, and a third bulk acoustic wave resonator connected in series. The second bulk acoustic wave resonator has a polarity different from a polarity of the first bulk acoustic wave resonator and a polarity of the third bulk acoustic wave resonator.

Second harmonic distortion occurring in the first bulk acoustic wave resonator may be delayed by an angle Ø when passing through the second bulk acoustic wave resonator and the third bulk acoustic wave resonator, and may satisfy $0<Ø=90$ or $270<Ø=360$.

The second bulk acoustic wave resonator may have a length different from a length of the first bulk acoustic wave resonator and a length of the third bulk acoustic wave resonator.

The length of the first bulk acoustic wave resonator may be the same as the length of the third bulk acoustic wave resonator.

A ratio of the length of the second bulk acoustic wave resonator to the length of the first bulk acoustic wave resonator may be in a range of 0.5 to 1.

The ratio of the length of the second bulk acoustic wave resonator to the length of the first bulk acoustic wave resonator may be in a range of 0.7 to 0.9.

A ratio of the length of the third acoustic wave resonator to the length of the first bulk acoustic wave resonator may be in a range of 0.5 to 1.

The ratio of the length of the third acoustic wave resonator to the length of the first bulk acoustic wave resonator may be in a range of 0.8 to 1.

The first bulk acoustic resonator, the second bulk acoustic wave resonator, and the third bulk acoustic wave resonator may be disposed on a single branch of a circuit constituting the filter.

In another general aspect, a filter includes series units and shunt units. Each series unit includes at least one bulk acoustic wave resonator. Each shunt unit includes at least one bulk acoustic wave resonator and is disposed between one of the series units and a ground. One of the series units or one of the shunt units includes a first bulk acoustic wave resonator, a second bulk acoustic wave resonator, and a third bulk acoustic wave resonator connected in series. Second harmonic distortion occurring in the first bulk acoustic wave resonator is delayed by an angle Ø when passing through the second bulk acoustic wave resonator and the third bulk acoustic wave resonator, and the angle Ø satisfies $90<Ø=270$.

The second bulk acoustic wave resonator may have a length different from a length of the first bulk acoustic wave resonator and a length of the third bulk acoustic wave resonator.

A length of the first bulk acoustic wave resonator may be the same as the length of the third bulk acoustic wave resonator.

A ratio of a length of the second bulk acoustic wave resonator to a length of the first bulk acoustic wave resonator may be in a range of 0.5 to 1.

The ratio of the length of the second bulk acoustic wave resonator to the length of the first bulk acoustic wave resonator may be in a range of 0.7 to 0.9.

A ratio of a length of the third bulk acoustic wave resonator to a length of the first bulk acoustic wave resonator may be in a range of 0.5 to 1.

The ratio of the length of the third bulk acoustic wave resonator to the length of the first bulk acoustic wave resonator may be in a range of 0.8 to 1.

In another general aspect, a bulk acoustic resonator set includes an input terminal, an output terminal, and a first bulk acoustic wave resonator, a second bulk acoustic wave resonator, and a third bulk acoustic wave resonator disposed between the input terminal and the output terminal. The first bulk acoustic wave resonator has a first polarity, the second bulk acoustic wave resonator has a second polarity that is opposite to the first polarity, and the third bulk acoustic wave resonator has a third polarity that is identical to either the first polarity or the second polarity.

The first bulk acoustic wave resonator, the second bulk acoustic wave resonator, and the third bulk acoustic wave resonator may be connected in series.

The first bulk acoustic wave resonator may have a first length, the second bulk acoustic wave resonator may have a second length less than the first length, and the third bulk acoustic wave resonator may have a third length less than or equal to the first length.

The third length may be greater than the second length.

In another general aspect, a bulk acoustic resonator set includes a first bulk acoustic wave resonator having a first length, a second bulk acoustic wave resonator having a second length less than the first length, and a third bulk acoustic wave resonator having a third length greater than the second length and less than or equal to the first length.

The first, second, and third bulk acoustic wave resonators may be connected in series between an input terminal and an output terminal, and only two of the first, second, and third bulk acoustic wave resonators may have a same polarity.

Other features and aspects will be apparent from the following detailed description, the drawings, and the claims.

BRIEF DESCRIPTION OF DRAWINGS

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

Figure 1:
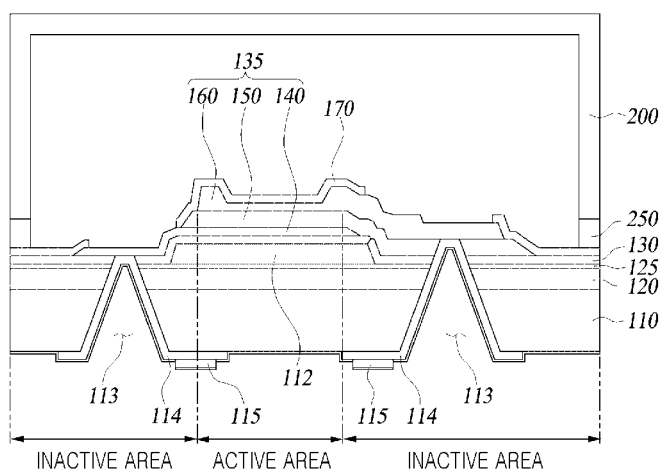
FIG. 1 is a cross-sectional view of a bulk acoustic wave resonator according to an example.

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known in the art may be omitted for increased clarity and conciseness.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application.

Herein, it is noted that use of the term "may" with respect to an example or embodiment, e.g., as to what an example or embodiment may include or implement, means that at least one example or embodiment exists in which such a feature is included or implemented while all examples and embodiments are not limited thereto.

Throughout the specification, when an element, such as a layer, region, or substrate, is described as being "on," "connected to," or "coupled to" another element, it may be directly "on," "connected to," or "coupled to" the other element, or there may be one or more other elements intervening therebetween. In contrast, when an element is described as being "directly on," "directly connected to," or "directly coupled to" another element, there can be no other elements intervening therebetween.

As used herein, the term "and/or" includes any one and any combination of any two or more of the associated listed items.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

Spatially relative terms such as "above," "upper," "below," and "lower" may be used herein for ease of description to describe one element's relationship to another element as shown in the figures. Such spatially relative terms are intended to encompass different orientations of the device in use or operation in addition to the orientation depicted in the figures. For example, if the device in the figures is turned over, an element described as being "above"

or "upper" relative to another element will then be "below" or "lower" relative to the other element. Thus, the term "above" encompasses both the above and below orientations depending on the spatial orientation of the device. The device may also be oriented in other ways (for example, rotated 90 degrees or at other orientations), and the spatially relative terms used herein are to be interpreted accordingly.

The terminology used herein is for describing various examples only, and is not to be used to limit the disclosure. The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof.

Due to manufacturing techniques and/or tolerances, variations of the shapes shown in the drawings may occur. Thus, the examples described herein are not limited to the specific shapes shown in the drawings, but include changes in shape that occur during manufacturing.

The features of the examples described herein may be combined in various ways as will be apparent after an understanding of the disclosure of this application. Further, although the examples described herein have a variety of configurations, other configurations are possible as will be apparent after an understanding of the disclosure of this application.

FIG. 1 is a cross-sectional view of a bulk acoustic wave resonator according to an example.

Referring to FIG. 1, a bulk acoustic wave resonator 10 may be a film bulk acoustic resonator (FBAR) or a solidly mounted resonator (SMR) type resonator.

The bulk acoustic wave resonator 10 may include a multilayer structure including a board 110, an insulating layer 120, an air cavity 112, a resonant portion 135 and a cap 200, coupled to the multilayer structure.

The board 110 may be a conventional silicon board, and the insulating layer 120 may be provided on a top surface of the board 110 to electrically isolate the resonant portion 135 from the board 110. The insulating layer 120 may be formed of at least one of silicon dioxide ($SiO_2$) and aluminum oxide ($Al_2O_3$) and may be provided on the board 110 through chemical vapor deposition, RF magnetron sputtering, or evaporation.

The air cavity 112 may be disposed above the insulating layer 120. The air cavity 112 may be disposed below the resonant portion 135 in such a manner that the resonant portion 135 vibrates in a predetermined direction. The air cavity 112 may be formed by forming a sacrificial layer on the insulating layer 120, forming a membrane 130 on the sacrificial layer, and removing the sacrificial layer through an etching process. The membrane 130 may serve as an oxide protection layer or a protection layer to protect the board 110.

An etch stop layer 125 may be additionally provided between the insulating layer 120 and the air cavity 112. The etch stop layer 125 may serve to protect the board 110 and the insulating layer 120 from an etching process and may serve as a base required to deposit multiple layers on the etch stop layer 125.

The resonant portion 135 may include a first electrode 140, a piezoelectric layer 150, and a second electrode 160 which are sequentially laminated on the membrane 130. A common area overlapping in a vertical direction of the first electrode 140, the piezoelectric layer 150, and the second electrode 160 may be disposed above the air cavity 112. The first electrode 140 and the second electrode 160 may be formed of a metal such as gold (Au), titanium (Ti), tantalum (Ta), molybdenum (Mo), ruthenium (Ru), platinum (Pt), tungsten (Al), iridium (Ir), and nickel (Ni), or alloys thereof.

The piezoelectric layer 150 is a portion causing a piezoelectric effect to convert electrical energy into mechanical energy in the form of an acoustic wave and may be formed of one of aluminum nitride (AlN), -zinc oxide (ZnO) and lead zirconate titanate (PZT; PbZrTiO). The piezoelectric layer 150 may further include a rare earth metal. As an example, the rare earth metal may include at least one of scandium (Sc), erbium (Er), yttrium (Y), and lanthanum (La), while the piezoelectric layer 150 may include the rare earth metal.

A seed layer may be additionally provided below the first electrode 140 to improve crystal orientation of the piezoelectric layer 150. The seed layer may be formed of one of aluminum nitride (AlN), and zinc oxide (ZnO), lead zirconate titanate (PZT; PbZrTiO) having the same crystallinity as the piezoelectric layer 150.

The resonant portion 135 may be divided into an active area and an inactive area. The active area of the resonant portion 135 is an area that vibrates and resonates in a predetermined direction due to a piezoelectric phenomenon occurring in the piezoelectric layer 150 when electrical energy such as a radio frequency (RF) signal is applied to the first electrode 140 and the second electrode 160. The active area of the resonant portion 135 corresponds to an area in which the first electrode 140, the piezoelectric layer 150, and the second electrode 160 vertically overlap each other above the air cavity 112. The inactive area of the resonant portion 135 is an area that does not resonate due to the piezoelectric effect, even when electrical energy is applied to the first electrode 140 and the second electrode 160. The inactive area of the resonant portion 135 corresponds to an area disposed outwardly of the active region.

The resonant portion 135 outputs an RF signal having a specific frequency using a piezoelectric phenomenon. The resonant portion 135 may output an RF signal having a resonant frequency corresponding to a vibration depending on the piezoelectric phenomenon of the piezoelectric layer 150.

A protection layer 170 may be provided on the second electrode 160 of the resonant portion 135 to prevent the second electrode 160 from being exposed outwardly. The protection layer 170 may be formed of one of silicon oxide-based, silicon nitride-based, aluminum oxide-based, and aluminum nitride-based insulating materials. Although a single multilayer structure is shown in FIG. 1 as being accommodated in a single cap 200, a plurality of multilayer structures may be accommodated in the single cap 200 and may be connected to each other according to a design. The plurality of multilayer structures may be connected to each other by preparing a wiring electrode on the first electrode 140 and the second electrode 160.

The cap 200 may be coupled to the multilayer structure to protect the resonant portion 135 from an external environment. The cap 200 may be formed in the form of a cover having an internal space in which the resonant portion 135 is accommodated. Specifically, the cap 200 may include an accommodation portion formed at the center of the cap 200 to accommodate the resonant portion 135 and may be coupled to the multilayer structure on an edge of the cap 200. Although the cap 200 is shown in FIG. 1 as being bonded to the protection layer 170 laminated on the board 110, the cap 200 may penetrate the protection layer 170 to be bonded to at least one of the membrane 130, the etch stop layer 125, the insulating layer 120, and the board 110.

The cap 200 may be bonded to the board 110 by eutectic bonding. In this case, the bonding is performed by pressurizing and heating a board wafer and a cap wafer after depositing an adhesive 250 eutectically-bondable to the board 110 on the multilayer structure. The adhesive 250 may include a eutectic material of copper-tin (Cu—Sn), and may further include a solder ball.

At least one via hole 113 may be formed in a bottom surface of the board 110 to penetrate the board 110 in a thickness direction. The via hole 113 may penetrate not only the board 110 but also portions of the insulating layer 120, the etch stop layer 125, and the membrane 130 in the thickness direction. A connection pattern 114 may be provided in the via hole 113. The connection pattern 114 may be provided on an internal surface of the via hole 113, for example, an entire internal wall of the via hole 113.

The connection pattern 114 may be formed by forming a conductive layer on the internal surface of the via hole 113. For example, the connection pattern 114 may be formed by depositing, coating or filling a conductive metal such as gold or copper along an internal wall of the via hole 113. As an example, the connection pattern 114 may be formed of a titanium-copper (Ti—Cu) alloy.

The connection pattern 114 may be connected to at least one of the first electrode 140 and the second electrode 160. As an example, the connection pattern 114 may penetrate at least a portion of the board 110, the membrane 130, the first electrode 140, and the piezoelectric layer 150 to be electrically connected to at least one of the first electrode 140 and the second electrode 160. The connection pattern 114 provided on the internal surface of the via hole 113 may extend to a bottom surface side of the board 110 to be connected to a board connection pad 115 provided on a bottom surface of the board 110. Thus, the connection pattern 114 may electrically connect the first electrode 140 and the second electrode 160 to the board connection pad 115.

The board connection pad 115 may be electrically connected to an external board, which may be disposed below the bulk acoustic wave resonator 10, through a bump. The bulk acoustic wave resonator 10 may perform a filtering operation of an RF signal by a signal applied to the first and second electrodes 140 and 160 through the board connection pad 115.

Figure 2:
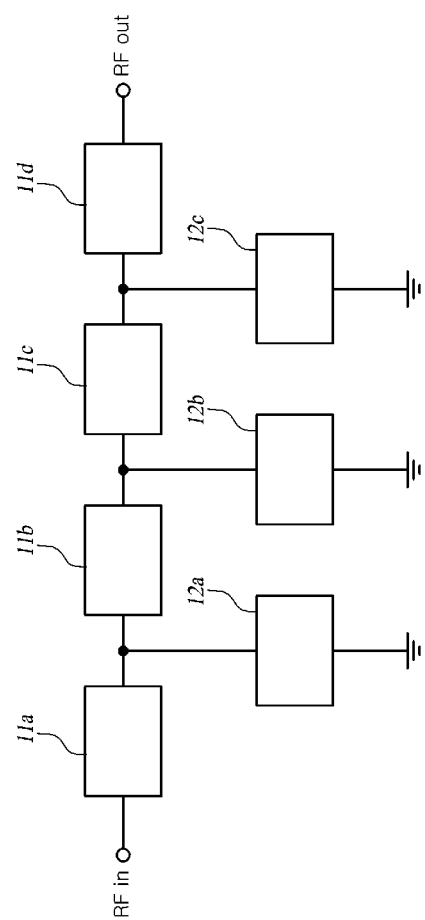
FIG. 2 is a circuit diagram of a filter according to an example.

FIG. 2 is a circuit diagram of a filter according to an example.

Referring to FIG. 2, a filter may include at least one series unit 11 and at least one shunt unit 12 disposed between the at least one series unit 11 and a ground. The filter may have a ladder-type filter structure, as shown in FIG. 2. Alternatively, the filter may have a lattice-type filter structure.

The at least one series unit 11 may be serially connected between a signal input terminal RFin to which an input signal is input and a single output terminal RFout to which an output signal is output. The shunt unit 12 may be connected between the series unit 11 and the ground. Although the filter is shown in FIG. 2 as including four series units 11a to 11d and three shunt units 12a to 12c, the number of the series units and the number of the shunt units may vary.

Each of the at least one series unit 11 and the at least one shunt unit 12 may include at least one a bulk acoustic wave resonator shown in FIG. 1, and the at least one bulk acoustic wave resonator may be connected in at least one of anti-parallel and anti-serial manners.

Figure 3:
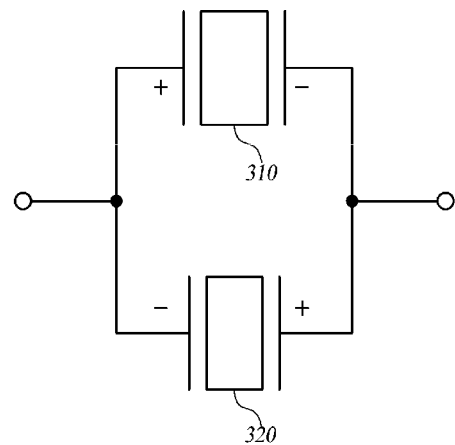
FIG. 3 is a circuit diagram of a plurality of bulk acoustic wave resonators connected in an anti-parallel manner.
Figure 4:
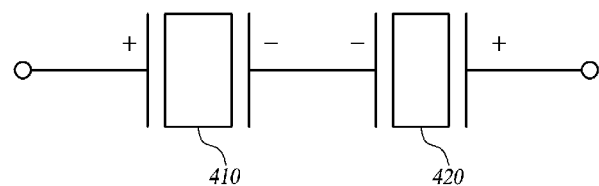
FIG. 4 is a circuit diagram of a plurality of bulk acoustic wave resonators connected in an anti-serial manner.

FIG. 3 is a circuit diagram of a plurality of bulk acoustic wave resonators connected in an anti-parallel manner, and FIG. 4 is a circuit diagram of a plurality of bulk acoustic wave resonators connected in an anti-serial manner.

Referring to FIGS. 3 and 4, two bulk acoustic wave resonators 310 and 320 shown in FIG. 3 are connected to each other in an anti-parallel manner and two bulk acoustic wave resonators 410 and 420 shown in FIG. 4 are connected to each other in an anti-serial manner. The term "anti-parallel" means that two bulk acoustic wave resonators are connected to each other in parallel in a state in which C-axis directions of the two bulk acoustic wave resonators are opposite to each other, and the term "anti-serial" means that two bulk acoustic wave resonators are connected to each other in series in a state in which C-axis directions of the two bulk acoustic wave resonators are opposite to each other.

When RF signals are applied to the bulk acoustic wave resonators shown in FIG. 3 or 4, the two bulk acoustic wave resonators may be connected to each other in parallel in the state in which the C axis directions of the two bulk acoustic wave resonators are opposite to each other. Thus, a vibration state of one of the two bulk acoustic wave resonators may be different from a vibration state of the other of the two bulk acoustic wave resonators. For example, when one of the bulk acoustic wave resonators is in an expansion state, the other of the bulk acoustic wave resonators may be in a contraction state. Therefore, nonlinear characteristics of the respective bulk acoustic wave resonators may be cancelled by each other due to opposing stimulus states of the two bulk acoustic wave resonators.

With a rapid increase in demand for radio frequency (RF) communications and the development of technology, an interval between frequency bands has been reduced to effectively use limited frequency resources. Accordingly, there is need for a technology to significantly reduce interference with other bands. In an RF filter for a wireless terminal, insertion loss characteristics need to be improved to significantly reduce interference with other frequency bands. In addition, second harmonic distortion (2HD) and intermodulation distortion (IMD) interfering with frequencies in other frequency bands need to be reduced.

In the case of a filter using a bulk acoustic wave resonator, bulk acoustic wave resonators having the same volume may be connected to each other in an anti-parallel or anti-serial structure to improve the insertion loss characteristics and reduce the second harmonic distortion and intermodulation distortion.

Figure 5:
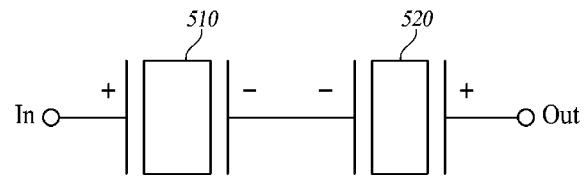
FIGS. 5, 6A, and 6B illustrate a reduction in second harmonic distortion.
Figure 6A:
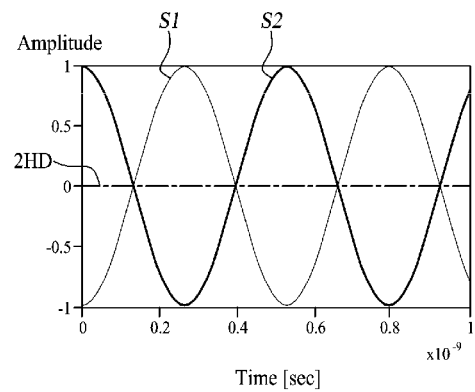
Figure 6B:
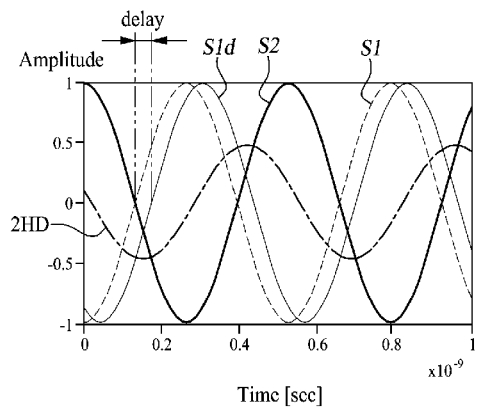

FIGS. 5, 6A, and 6B illustrate reductions in second harmonic distortion.

FIG. 5 is a circuit diagram of a filter including bulk acoustic wave resonators 510 and 520 connected in an anti-parallel manner, and FIGS. 6A and 6B show a response curve of second harmonic distortion of the bulk acoustic wave resonators 510 and 520.

When an RF signal having a frequency of f0 is input to an input terminal In, second harmonic distortions corresponding to $\alpha*\cos(4\pi f0 t)$ occur in a first bulk acoustic wave resonator 510 and a second bulk acoustic wave resonator 520, respectively.

Referring to FIG. 6A, since second harmonic distortion S1 occurring in the first bulk acoustic wave resonator 510 and second harmonic distortion S2 occurring in the second bulk acoustic wave resonator 520 have opposite polarities, the second harmonic distortions S1 and S2 are ideally cancelled by each other to be removed.

Referring to FIG. 6B, the second harmonic distortion S1 occurring in the first bulk acoustic wave resonator 510 is output at an output terminal Out as delayed second harmonic distortion S1d corresponding to α*cos(4πf0t−Ø) while passing through the second bulk acoustic wave resonator 520. For example, the second harmonic distortion of the first bulk acoustic wave resonator 510 output to the output terminal Out is delayed by an angle Ø from the ideal second harmonic distortion S1 before passing through the second bulk acoustic wave resonator 520. For example, the actual second harmonic distortion S1d of the first bulk acoustic wave resonator 510 is delayed by a time of Ø/4πf0 from the ideal second harmonic distortion S1.

Accordingly, the second harmonic distortion (2HD) of the filter is not completely removed and second harmonic distortion of α*(2−2 cos Ø)0.5 occurs. As an example, when the angle Ø is 23 degrees, about five percent of the second harmonic distortion is removed.

Figure 7:
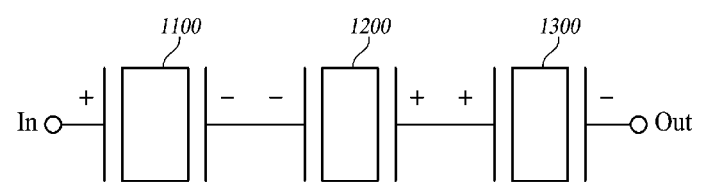
FIG. 7 is a circuit diagram of a bulk acoustic wave resonator set applied to a series unit and a shunt unit according to an example.

FIG. 7 is a circuit diagram of a bulk acoustic wave resonator set applied to a series unit and a shunt unit according to an example.

A bulk acoustic wave resonator set according to an example may include a first bulk acoustic wave resonator 1100, a second bulk acoustic wave resonator 1200, and a third bulk acoustic wave resonator 1300 disposed between an input terminal In and an output terminal Out.

As shown in FIG. 7, the first bulk acoustic wave resonator 1100 and the second bulk acoustic wave resonator 1200 may be connected in an anti-serial manner, and the second bulk acoustic wave resonator 1200 and the third bulk acoustic wave resonator 1300 may be connected in an anti-serial manner.

Second harmonic distortion S1 occurring in the first bulk acoustic wave resonator 1100 is α1*cos(4πf0t), second harmonic distortion S2 occurring in the second bulk acoustic wave resonator 1200 is α2*cos(4πf0t), and second harmonic distortion S3 occurring in the third bulk acoustic wave resonator 1300 is α3*cos(4πf0t). When a time delay corresponding to Ø/4πf0 occurs whenever passing through each bulk acoustic wave resonator, the second harmonic distortion S1 occurring in the first bulk acoustic wave resonator 1100 is output at the output terminal Out as delayed second harmonic distortion S1d of Equation (1), and the second harmonic distortion S2 occurring in the second bulk acoustic wave resonator 1200 is output at the output terminal Out as delayed second harmonic distortion S2d of Equation (1).

$$S1d = \alpha 1 * \cos(4\pi f_0 t - 2\emptyset)$$

$$S2d = \alpha 2 * \cos(4\pi f_0 t - \emptyset) \quad \text{Equation (1)}$$

Accordingly, ultimate second harmonic distortion S of the entire bulk acoustic wave resonator set may be expressed by Equation (2). Equation (2) may be changed to Equation (3).

$$S = S1d + S2d + S3 = \alpha 1 * \cos(4\pi f_0 t - 2\emptyset) + \quad \text{Equation (2)}$$
$$\alpha 2 * \cos(4\pi f_0 t - \emptyset) + \alpha 3 * \cos(4\pi f_0 t)$$

$$S = \cos(4\pi f_0 t) * [\alpha 1 * \cos(2\emptyset) + \alpha 2 * \cos(\emptyset) + \alpha 3] + \quad \text{Equation (3)}$$
$$\sin(4\pi f_0 t) * [\alpha 1 * \sin(2\emptyset) + \alpha 2 * \sin(\emptyset)]$$

The second harmonic distortion S needs to satisfy Equation (4) to satisfy zero (0).

$$\alpha 1 * \cos(2\emptyset) + \alpha 2 * \cos(\emptyset) + \alpha 3 = 0$$

$$\alpha 1 * \sin(2\emptyset) + \alpha 2 * \sin(\emptyset) = 0 \quad \text{Equation (4):}$$

A relationship of α1, α2, and α3 satisfying Equation (4) may be expressed by Equation (5).

$$\alpha 2 = -2\alpha 1 * \cos(\emptyset)$$

$$\alpha 3 = \alpha 1 \quad \text{Equation (5):}$$

Referring to FIG. 7, in the case in which 0<Ø≤90 or 270<Ø≤360, polarities of the first bulk acoustic wave resonator 1100 and the third bulk acoustic wave resonator 1300 should be identical to each other, and polarity of the second bulk acoustic wave resonator 1200 should be opposite to polarities of the first bulk acoustic wave resonator 1100 and the third bulk acoustic wave resonator 1300. In the case in which 90<Ø≤270, the polarity of the second bulk acoustic wave resonator 1200 should be identical to the polarities of the first bulk acoustic wave resonator 1100 and the third bulk acoustic wave resonator 1300.

For example, in the case in which 0<Ø≤90 or 270<Ø≤360 (Ø being a delay angle) whenever passing through each bulk acoustic wave resonator, the polarity of the second bulk acoustic wave resonator 1200 is opposite to the polarities of the first bulk acoustic wave resonator 1100 and the third bulk acoustic wave resonator 1300, as shown in FIG. 7. In contrast, in the case in which 90<Ø≤270 (Ø being a delay angle) whenever passing through each bulk acoustic wave resonator, the polarities of the first bulk acoustic wave resonator 1100, the second bulk acoustic wave resonator 1200, and the third bulk acoustic wave resonator 1300 may all be identical to each other, unlike what is shown in FIG. 7.

Figure 8:
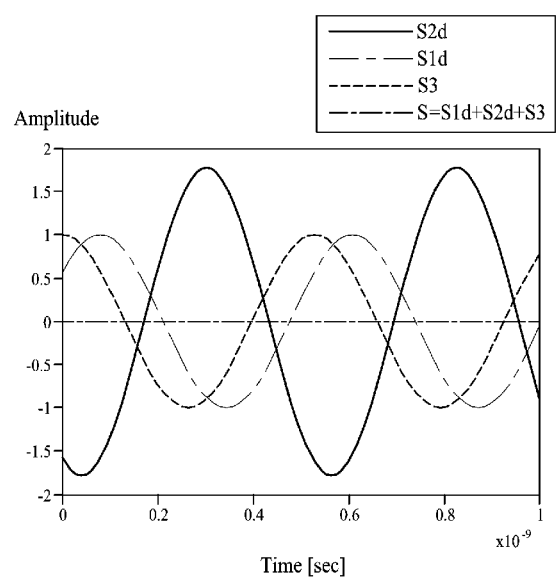
FIG. 8 is a graph of second harmonic distortion of a bulk acoustic wave resonator set according to the example of FIG. 7.

FIG. 8 is a graph of second harmonic distortion of a bulk acoustic wave resonator set according to the example of FIG. 7.

The graph of FIG. 8 illustrates second harmonic distortion when the bulk acoustic wave resonator set in FIG. 7 satisfies Equation (5).

As can be seen from FIG. 8, when the bulk acoustic wave resonator set satisfies Equation (5), delayed second harmonic distortion S1d of the first bulk acoustic wave resonator 1100, delayed second harmonic distortion S2d of the second bulk acoustic wave resonator 1200, and second harmonic distortion S3 of the third bulk acoustic wave resonator 1300 are cancelled by each other, and thus the total second harmonic distortion h caused by the first bulk acoustic wave resonator 1100, the second bulk acoustic wave resonator 1200, and the third bulk acoustic wave resonator 1300 is zero (0).

Figure 9:
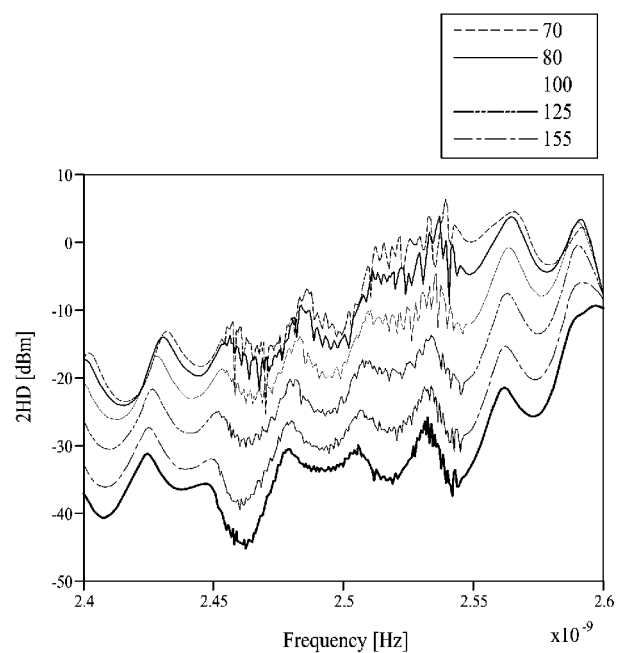
FIG. 9 is a graph of second harmonic distortion depending on a length of a bulk acoustic wave resonator according to an example.
Figure 10:
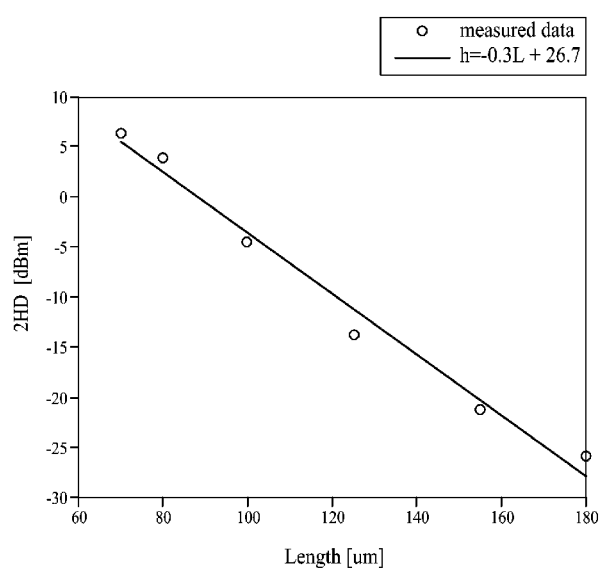
FIG. 10 is a graph illustrating a correlation between second harmonic distortion and a length of a bulk acoustic wave resonator according to an example.

FIG. 9 is a graph of second harmonic distortion depending on a length of a bulk acoustic wave resonator according to an example, and FIG. 10 is a graph illustrating a correlation between second harmonic distortion and a length of a bulk acoustic wave resonator according to an example.

As can be seen from FIG. 9, in the case of a single bulk acoustic wave resonator, a magnitude of second harmonic distortion varies depending on a length (hereinafter referred to as "L") of the bulk acoustic wave resonator. The length L of the bulk acoustic wave resonator may be defined by a relationship with an area S thereof, as follows: L=S1/2.

Referring to FIGS. 9 and 10, a relationship between second harmonic distortion power h and the length L of the bulk acoustic wave resonator at a frequency of 2.54 GHz may be approximated as expressed in Equation (6). In Equation (6), a may correspond to −0.3 and K may correspond to 27.

$$h = \alpha * L + K \quad \text{Equation (6):}$$

In Equation (6), the second harmonic distortion power h is expressed as [dBm] of harmonic distortion power generated in the bulk acoustic wave resonator when input power of 30 dBm is input. Since a relationship between power h'

(unit: W) and a voltage wavelength α is h'=a2/(2*z0) and h=10*log 10(1000*h'), Equation (6) may be expressed as Equation (7).

$$h = 10\log_{10}(h') + 30 \quad \text{Equation (7)}$$

$$10\log_{10}(h') + 30 = a*L + K$$

$$10\log_{10}h' = a*L + K - 30$$

$$10\log_{10}\frac{\alpha^2}{2z0} = a*L + K - 30$$

$$10\log_{10}(\alpha^2) = a*L + K - 30 + 10\log_{10}(2*z0)$$

$$20\log_{10}(\alpha) = a*L + K'$$

Referring to Equation (5), since $-\alpha2/\alpha1=2 \cos \emptyset$, Equation (7) may be expressed as Equation (8). In Equation (8), L1 denotes a length of the first bulk acoustic wave resonator 1100 and L2 denotes a length of the second bulk acoustic wave resonator 1200.

$$20 \log_{10}(\alpha1) = \alpha*L1 + K'$$

$$20 \log_{10}(-\alpha2) = \alpha*L2 + K'$$

$$20 \log_{10}(-\alpha2/\alpha1) = 20 \log_{10}(2 \cos \emptyset) = \alpha(L2-L1) \quad \text{Equation (8)}:$$

Accordingly, the length L1 of the first bulk acoustic wave resonator 1100, the length L2 of the second bulk acoustic wave resonator 1200, and a length L3 of a third bulk acoustic wave resonator 1300 may satisfy Equation (9).

$$L2 = L1 + 20 \log_{10}(2 \cos \emptyset)/\alpha$$

$$L3 = L1 \quad \text{Equation (9)}:$$

Referring to Equation (9), the length L1 of the first bulk acoustic wave resonator 1100 and the length L3 of the third bulk acoustic wave resonator 1300 are equal to each other, while the length L2 of the second bulk acoustic wave resonator 1200 may be different from the length L1 of the first bulk acoustic wave resonator 1100 and the length L3 of the third bulk acoustic wave resonator 1300.

As an example, in Equation (9), the length L2 of the second bulk acoustic wave resonator 1200 is 62.3 μm and the length L3 of the third bulk acoustic wave resonator 1300 is 80 μm when the length L1 of the first bulk acoustic wave resonator 1100 is 80 μm and Ø is 23 degrees.

When the length L2 of the second bulk acoustic wave resonator 1200 is different from the length L3 of the third bulk acoustic wave resonator 1300, the second harmonic distortion of the first bulk acoustic wave resonator 1100 causes time or angle delayed in the second bulk acoustic wave resonator 1200 to be different from time or angle delayed in the third bulk acoustic wave resonator 1300. Therefore, the second harmonic distortion of the entire resonator set is not completely removed. The second harmonic distortion of the entire resonator set, in which the length L2 of the second bulk acoustic wave resonator 1200 is different from the length L3 of the third bulk acoustic wave resonator 1300, is not completely removed. Such a phenomenon will be described below with reference to FIG. 11.

Figure 11:
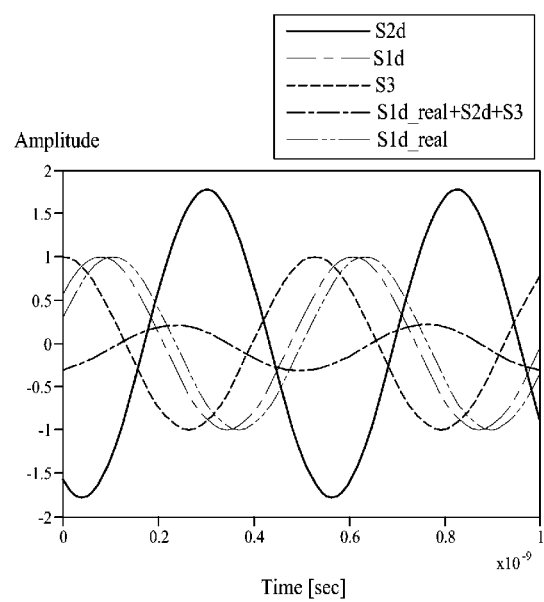
FIG. 11 is a graph illustrating second harmonic distortion of a bulk acoustic wave resonator set according to the example of FIG. 7.

FIG. 11 is a graph illustrating second harmonic distortion of a bulk acoustic wave resonator set according to the example of FIG. 7. Specifically, the graph of FIG. 11 illustrates second harmonic distortion when the bulk acoustic wave resonator set according to an example of FIG. 7 satisfies Equation (9).

In FIG. 11, second harmonic distortion S1$d$ of the first bulk acoustic wave resonator 1100 output to the output terminal Out is illustrated by a graph that does not reflect a delay caused by change in length of the second bulk acoustic wave resonator 1200. And second harmonic distortion S1$d$_real of the first bulk acoustic wave resonator 1100 output to the output terminal Out is illustrated by a graph that reflects a delay caused by change in length of the second bulk acoustic wave resonator 1200.

Referring to FIG. 11, the delay of the second harmonic distortion S1$d$_real of the first bulk acoustic wave resonator 1100 output to the output terminal Out is increased by the change in length of the second bulk acoustic wave resonator 1200. Accordingly, second harmonic distortion of the entire resonator set is not completely removed.

As a result, it is necessary to compensate for delay variation depending on a difference between the length of the second bulk acoustic wave resonator 1200 and the length of the third bulk acoustic wave resonator 1300.

Figure 12:
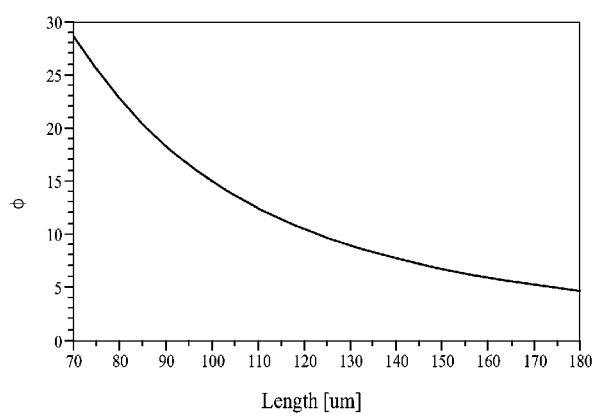
FIG. 12 is a graph illustrating an angle of delay depending on a length of a bulk acoustic wave resonator according to an example.

FIG. 12 is a graph illustrating an angle of delay depending on a length of a bulk acoustic wave resonator according to an example.

Referring to FIG. 12, a delay angle Ø varies depending on a length L of a bulk acoustic wave resonator. Specifically, the greater the length L of the bulk acoustic wave resonator, the smaller the delay angle Ø, while the smaller the length L of the bulk acoustic wave resonator, the greater the delay angle Ø.

When delay variation depending on the length of the bulk acoustic wave resonator is reflected, a rate of second harmonic distortion may be expressed by Equation (10).

$$S1d = \alpha1*\cos(4\pi f_0 t - \emptyset2 - \emptyset3)$$

$$S2d = \alpha2*\cos(4\pi f_0 t - \emptyset3)$$

$$S3 = \alpha3*\cos(4\pi f_0 t)$$

$$S = \alpha1*\cos(4\pi f_0 t - \emptyset2 - \emptyset3) + \alpha2*\cos(4\pi f_0 t - \emptyset3) + \alpha3*\cos(4\pi f_0 t)$$

$$S = \alpha1*\cos(4\pi f_0 t)\cos(\emptyset2+\emptyset3) + \sin(4\pi f_0 t)\sin(\emptyset2+\emptyset3)) + \alpha2*(\cos(4\pi f_0 t)\cos(\emptyset3) + \sin(4\pi f_0 t)\sin(\emptyset3)) + \alpha3*\cos(4\pi f_0 t)$$

$$S = \cos(4\pi f_0 t)*(\alpha1*\cos(\emptyset2+\emptyset3) + \alpha2*\cos(\emptyset3) + \alpha3) + \sin(4\pi f_0 t)*(\alpha1*\sin(\emptyset2+\emptyset3) + \alpha2*\sin(\emptyset3)) \quad \text{Equation (10)}:$$

A condition for allowing S of Equation (10) to be zero (0) is shown in Equation (11).

$$\alpha1*\cos(\emptyset2+\emptyset3) + \alpha2*\cos(\emptyset3) + \alpha3 = 0$$

$$\alpha1*\sin(\emptyset2+\emptyset3) + \alpha2*\sin(\emptyset3) = 0 \quad \text{Equation (11)}:$$

In Equation (11), a2 and a3 may be obtained as shown in Equation (12).

$$\alpha_2 = -\alpha_1*\sin(\emptyset2+\emptyset3)/\sin(\emptyset3)$$

$$\alpha_3 = \alpha_1*[\sin(\emptyset2+\emptyset3)*\cos \emptyset3/\sin(\emptyset3) - \cos(\emptyset2+\emptyset3)] \quad \text{Equation (12)}:$$

In Equation (10), a delay angle Ø2 in the second bulk acoustic wave resonator 1200 and a delay angle Ø3 in the third bulk acoustic wave resonator 1300 are functions for the length L2 of the bulk acoustic wave resonator 1200 and the length L3 of the third bulk acoustic wave resonator 1300, respectively, and may be expressed as Ø2(L2) and Ø3(L3), respectively. The length L2 of the second bulk acoustic wave resonator 1200 and the length L3 of the third bulk acoustic wave resonator 1300 may be expressed by Equation (13) induced by Equation (8) and Equation (12).

$$L2 = L1 + 20\log 10(-\alpha 2/\alpha 1)/\alpha$$

$$L3 = L1 + 20\log 10(\alpha 3/\alpha 1)/\alpha$$

$$L2 = L1 + 20\log 10[\sin(\emptyset 2 + \emptyset 3)/\sin(\emptyset 3)]/\alpha$$

$$L3 = L1 + 20\log 10[\sin(\emptyset 2 + \emptyset 3) * \cos(\emptyset 3)/\sin(\emptyset 3) - \cos(\emptyset 2 + \emptyset 3)]/\alpha \quad \text{Equation (13):}$$

In the case in which the length L1 of the first bulk acoustic wave resonator 1100 is 80 μm, the length L2 of the second bulk acoustic wave resonator 1200 and the length L3 of the third bulk acoustic wave resonator 1300 satisfying Equation (11) are 60.5 μm and 72.5 μm, respectively. In this case, the delay angle Ø2 of the second bulk acoustic wave resonator 1200 is 36 degrees and the delay angle Ø3 of the third bulk acoustic wave resonator 1300 is 27 degrees.

Figure 13:
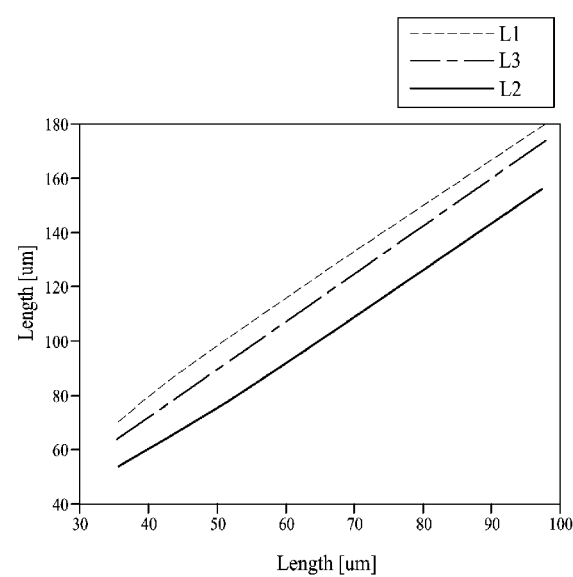
FIG. 13 illustrates lengths of first to third bulk acoustic wave resonators to remove second harmonic distortion according to an example.

FIG. 13 illustrates lengths of first to third bulk acoustic wave resonators to remove second harmonic distortion according to an example.

Referring to FIG. 13, a horizontal axis denotes a length of a single bulk acoustic wave resonator having the same impedance as impedance when first to third bulk acoustic wave resonators are connected in series. A vertical axis denotes lengths of the first to third bulk acoustic wave resonators corresponding to a length of a single bulk acoustic wave resonator.

As an example, impedance of a single bulk acoustic wave resonator having a length of 40 μm may be equal to impedance in the case in which the first bulk acoustic wave resonator 1100 having the length L1 of 80 μm, the second bulk acoustic wave resonator 1200 having a length of 60.5 μm, and the third bulk acoustic wave resonator 1300 having the length L3 of 72.5 μm are connected in series.

Figure 14:
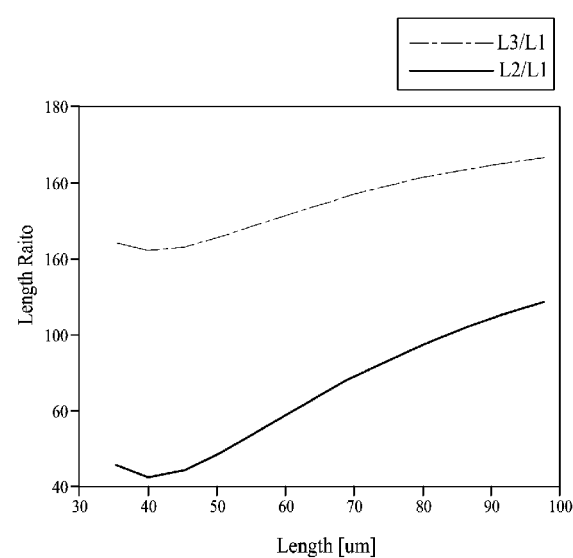
FIG. 14 illustrates ratios of lengths of a second bulk acoustic wave resonator and a third bulk acoustic wave resonator to a length of a first bulk acoustic wave resonator to remove second harmonic distortion according to an example.

FIG. 14 illustrates ratios of lengths of a second bulk acoustic wave resonator and a third bulk acoustic wave resonator to a length of a first bulk acoustic wave resonator to remove second harmonic distortion according to an example.

Referring to FIG. 14, a ratio of a length of a second bulk acoustic wave resonator to a length of a first bulk acoustic wave resonator (L2/L1) ranges from 0.5 to 1, in more detail, ranges from 0.7 to 0.9. A ratio of a length of a third bulk acoustic wave resonator to the length of the first bulk acoustic wave resonator (L3/L1) ranges from 0.5 to 1, in more detail, ranges from 0.8 to 1.

Figure 15A:
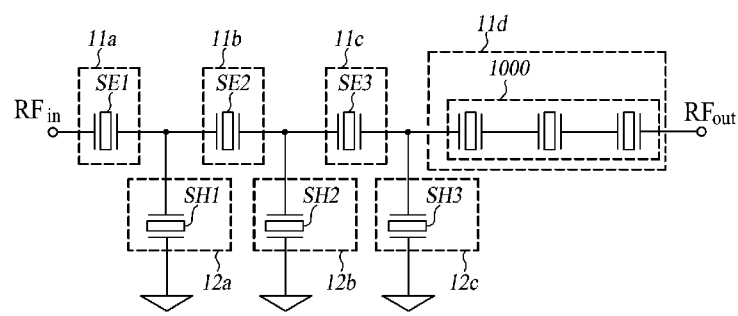
FIG. 15A and FIG. 15B are circuit diagrams of a filter to which a bulk acoustic wave resonator according to an example is applied.
Figure 15B:
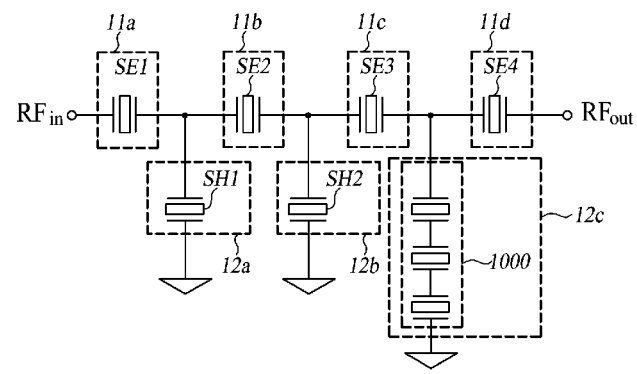

FIG. 15A and FIG. 15B are circuit diagrams of a filter to which a bulk acoustic wave resonator according to an example is applied.

Referring to FIG. 15A and FIG. 15B, a bulk acoustic wave resonator according to an example may be applied to at least one of series units 11a, 11b, 11c, and 11d and at least one of shunt units 12a, 12b, and 12c.

Referring to FIG. 15A, a first series unit 11a, a second series unit 11b, and a third series unit 11c may include a first series resonator SE1, a second series resonator SE2, and a third series resonator SE3, respectively, and a fourth series unit 11d may include a resonator set 1000 according to an example. A first shunt unit 12a, a second shunt unit 12b, and a third shunt unit 12c may include a first shunt resonator SH1, a second shunt resonator SH2, and a third shunt resonator SH3, respectively.

Although the resonator set 1000 according to an example is shown in FIG. 15A as being applied to the fourth series unit 11d, the resonator set according to an example may be applied to one of the first series unit 11a, the second series unit 11b, and the third series unit 11c.

Referring to FIG. 15B, a first series unit 11a, a second series unit 11b, a third series unit 11c, and a fourth series unit 11d may include a first series resonator SE1, a second series resonator SE2, a third series resonator SE3, and a fourth series resonator SE4, respectively. A first shunt unit 12a and a second shunt unit 12b may include a first shunt resonator SH1 and a second shunt resonator SH2, respectively and the third shunt unit 12c may include a resonator set 1000 according to an example.

Although the resonator set 1000 according to an example is shown in FIG. 15B as being applied to the third shunt unit 12c, the resonator set according to an example may be applied to one of the first shunt unit 12a and the second shunt unit 12b.

A circuit that includes a filter according to the examples disclosed herein may have the first bulk acoustic resonator, the second bulk acoustic wave resonator, and the third bulk acoustic wave resonator disposed on a single branch of the circuit.

As described above, a filter according to an example may reduce second harmonic distortion and intermodulation distortion.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A filter comprising:
    series units, each series unit comprising at least one bulk acoustic wave resonator; and
    shunt units, each shunt unit comprising at least one bulk acoustic wave resonator, each of the shunt units being disposed between one of the series units and a ground,
    wherein one of the series units or one of the shunt units comprises a first bulk acoustic wave resonator, a second bulk acoustic wave resonator, and a third bulk acoustic wave resonator connected in series,
    the second bulk acoustic wave resonator has a polarity different from a polarity of the first bulk acoustic wave resonator and a polarity of the third bulk acoustic wave resonator, and
    wherein second harmonic distortion occurring in the first bulk acoustic wave resonator is delayed by an angle Ø when passing through the second bulk acoustic wave resonator and the third bulk acoustic wave resonator, and 0<Ø≤90 or 270<Ø≤360.

2. The filter of claim 1, wherein the first bulk acoustic resonator, the second bulk acoustic wave resonator, and the third bulk acoustic wave resonator are disposed on a single branch of a circuit constituting the filter.

3. The filter of claim 1, wherein the second bulk acoustic wave resonator has a length different from a length of the first bulk acoustic wave resonator and a length of the third bulk acoustic wave resonator.

4. The filter of claim 3, wherein the length of the first bulk acoustic wave resonator is the same as the length of the third bulk acoustic wave resonator.

5. The filter of claim 3, wherein a ratio of the length of the second bulk acoustic wave resonator to the length of the first bulk acoustic wave resonator is in a range of 0.5 to 1.

6. The filter of claim 5, wherein the ratio of the length of the second bulk acoustic wave resonator to the length of the first bulk acoustic wave resonator is in a range of 0.7 to 0.9.

7. The filter of claim 3, wherein a ratio of the length of the third bulk acoustic wave resonator to the length of the first bulk acoustic wave resonator is in a range of 0.5 to 1.

8. The filter of claim 7, wherein the ratio of the length of the third bulk acoustic wave resonator to the length of the first bulk acoustic wave resonator is in a range of 0.8 to 1.

9. A bulk acoustic resonator set, comprising:
a first bulk acoustic wave resonator having a first length;
a second bulk acoustic wave resonator having a second length less than the first length; and
a third bulk acoustic wave resonator having a third length greater than the second length and less than or equal to the first length,
wherein the first, second, and third bulk acoustic wave resonators are connected in series between an input terminal and an output terminal, and only two of the first, second, and third bulk acoustic wave resonators have a same polarity.

10. A filer comprising:
series units, each series unit comprising at least one bulk acoustic wave resonator; and
shunt units, each shunt unit comprising at least one bulk acoustic wave resonator, each of the shunt units being disposed between one of the series units and a ground,
wherein one of the series units or one of the shunt units comprises a first bulk acoustic wave resonator, a second bulk acoustic wave resonator, and a third bulk acoustic wave resonator connected in series, and
second harmonic distortion occurring in the first bulk acoustic wave resonator is delayed by an angle Ø when passing through the second bulk acoustic wave resonator and the third bulk acoustic wave resonator, and the angle Ø satisfies 90<Ø≤270.

11. The filter of claim 10, wherein the second bulk acoustic wave resonator has a length different from a length of the first bulk acoustic wave resonator and a length of the third bulk acoustic wave resonator.

12. The filter of claim 11, wherein the length of the first bulk acoustic wave resonator is the same as the length of the third bulk acoustic wave resonator.

13. The filter of claim 10, wherein a ratio of a length of the second bulk acoustic wave resonator to a length of the first bulk acoustic wave resonator is in a range of 0.5 to 1.

14. The filter of claim 13, wherein the ratio of the length of the second bulk acoustic wave resonator to the length of the first bulk acoustic wave resonator is in a range of 0.7 to 0.9.

15. The filter of claim 10, wherein a ratio of a length of the third bulk acoustic wave resonator to a length of the first bulk acoustic wave resonator is in a range of 0.5 to 1.

16. The filter of claim 15, wherein the ratio of the length of the third bulk acoustic wave resonator to the length of the first bulk acoustic wave resonator is in a range of 0.8 to 1.

17. A bulk acoustic resonator set, comprising:
an input terminal;
an output terminal; and
a first bulk acoustic wave resonator, a second bulk acoustic wave resonator, and a third bulk acoustic wave resonator disposed between the input terminal and the output terminal,
wherein the first bulk acoustic wave resonator has a first polarity, the second bulk acoustic wave resonator has a second polarity that is opposite to the first polarity, and the third bulk acoustic wave resonator has a third polarity that is identical to either the first polarity or the second polarity, and
wherein the first bulk acoustic wave resonator has a first length, the second bulk acoustic wave resonator has a second length less than the first length, and the third bulk acoustic wave resonator has a third length less than or equal to the first length.

18. The bulk acoustic resonator set of claim 17, wherein the first bulk acoustic wave resonator, the second bulk acoustic wave resonator, and the third bulk acoustic wave resonator are connected in series.

19. The bulk acoustic resonator set of claim 17, wherein the third length is greater than the second length.

* * * * *